(12) United States Patent
Schletterer et al.

(10) Patent No.: US 7,529,046 B2
(45) Date of Patent: May 5, 2009

(54) OPTICAL ELEMENT

(75) Inventors: Thomas Schletterer, Koenigsbronn (DE); Franz Sorg, Oberkochen (DE)

(73) Assignee: Carl Zeiss SMT AG, Oberkochen (DE)

( * ) Notice: Subject to any disclaimer, the term of this patent is extended or adjusted under 35 U.S.C. 154(b) by 59 days.

(21) Appl. No.: 11/578,364

(22) PCT Filed: Apr. 13, 2005

(86) PCT No.: PCT/EP2005/003900

§ 371 (c)(1),
(2), (4) Date: Oct. 13, 2006

(87) PCT Pub. No.: WO2005/101082

PCT Pub. Date: Oct. 27, 2005

(65) Prior Publication Data

US 2007/0201151 A1    Aug. 30, 2007

(30) Foreign Application Priority Data

Apr. 13, 2004 (DE) ........................ 10 2004 018 656

(51) Int. Cl.
G02B 7/02 (2006.01)
(52) U.S. Cl. ........................ 359/819; 359/823
(58) Field of Classification Search ................ 359/696, 359/819, 811, 814, 823, 824
See application file for complete search history.

(56) References Cited

U.S. PATENT DOCUMENTS 5,683,223 A * 11/1997 Harada et al. .................. 415/17
5,822,133 A * 10/1998 Mizuno et al. ............... 359/696
5,973,863 A * 10/1999 Hatasawa et al. ............ 359/823
2002/0163741 A1 11/2002 Shibazaki
2003/0095345 A1 5/2003 Yoshida ....................... 359/819

FOREIGN PATENT DOCUMENTS

| EP | 1 179 746 A | 2/2002 |
| EP | 1 338 911 A | 8/2003 |
| WO | WO 2004/001509 A1 | 12/2003 |
| WO | WO 2004/011984 | 2/2004 |

OTHER PUBLICATIONS

International Search Report dtaed Jul. 18, 2005 based on PCT/EP2005/003900.

* cited by examiner

*Primary Examiner*—Mohammed Hasan
(74) *Attorney, Agent, or Firm*—Ohlandt, Greeley, Ruggiero & Perle, L.L.P

(57) ABSTRACT

There is provided an optical element. The optical element includes an element body having an optically effective region that has an optical axis and a peripheral region extending in a circumferential direction of the element body, a holding region disposed in the peripheral region, and a contact region in the holding region. The holding region co-operates with a holding device to hold the element body. The contact region is configured with a first contact surface and a second contact surface that are (a) spaced apart from one another in a direction of the optical axis, (b) both inclined with respect to the optical axis; and (c) not parallel to one another.

38 Claims, 11 Drawing Sheets

OPTICAL ELEMENT

BACKGROUND OF THE INVENTION

This invention relates to an optical element and to an optical arrangement which comprises this type of optical element. The invention can be used in connection with the microlithography used in the production of microelectronic circuits. It therefore further relates to a lens barrel which is particularly suitable for use in a microlithography device and a microlithography device comprising this type of lens barrel.

For a plurality of optical applications, particularly however in the field of the aforementioned microlithography, it is necessary to position the optical elements used, for example lenses or plane-parallel plates, with the greatest possible accuracy within the space. In particular several of these optical elements must generally be positioned here relative to one another with corresponding accuracy. Due to the ever progressive miniaturisation of the microelectronic circuits to be produced, there is a constant need to increase the resolution of the optical systems used during production.

With increased resolution, the requirements for the accuracy of the optical elements themselves used also, among other things, become more stringent. This must be maintained as far as possible in the mounted state over the whole period of operation. It is particularly necessary here also to hold the optical element with as little stress as possible during operation in order to avoid image errors as a result of deformation of the optical element. Furthermore, in this context, it is necessary to achieve the most favourable dynamic behaviour possible of the optical system used with the highest resonant frequencies possible.

In order to achieve holding of this type of optical element with a small amount of stress, it is known from US 2002/0163741 A1 to hold a lens by means of three holding elements disposed on an annular frame. These holding elements respectively grab a ledge extending around the circumference of the lens and having contact surfaces disposed perpendicularly to the optical axis. The respective holding element clamps the ledge in the direction of the optical axis by means of the contact surfaces in two regions spaced apart from one another in the circumferential direction. In order to avoid the introduction of deformations of the frame via the two clamping regions spaced apart from one another into the lens, a mounting of the holding element on the frame is provided which provides corresponding degrees of freedom.

This design has, on the one hand, the disadvantage that a comparatively expensive mounting is required for the respective holding element. On the other hand, for the production of the contact surfaces a comparatively large region of the lens has to be processed with correspondingly high cost in order to ensure sufficient precision of the contact regions.

Furthermore, from DE 101 39 805 C1 a holder for a lens is known wherein three holding elements distributed around the circumference of the lens radially engage a V-shaped annular groove extending around the circumference of the lens. These holding elements lie against the lens with a certain pre-stress and in this way hold it, both, in the direction of the optical axis and in the circumferential direction and in the radial direction. The defined pre-stress is achieved here by the design of one of the holding elements being resilient in the radial direction.

This design too has the disadvantage, on the one hand, that for the circumferential V-shaped annular groove a comparably large region of the lens must be processed with correspondingly high cost in order to ensure that there is sufficient precision of the contact regions. A further disadvantage of the design is the fact that, on the one hand, it is only suitable to a certain extent for thin lenses, and on the other hand, increased production expenditure is required due to the risk of fractures on the lens.

Therefore, the objective which forms the basis of this invention is to provide an optical element and an optical arrangement of the type specified above which does not have the aforementioned disadvantages or at least only has them to a lesser degree, and in particular enables holding with as little stress as possible at simple producibility.

SUMMARY OF THE INVENTION

This invention achieves this objective by means of an optical element having the features of claim 1. Furthermore, it achieves this objective by means of an optical arrangement having the features of claim 14.

The invention is based on the finding that with simple producibility, low-stress holding of the optical element is possible if the processing of the optical element in order to produce the contact regions for the corresponding holding device is performed in a manner limited in the circumferential direction and, in addition or alternatively, limited in the direction of the optical axis at the circumferential outer edges of the optical element which are easy to process. In this way, only the contact regions actually used for the contact need be subjected to correspondingly expensive processing, by means of which the cost of producing the holding region on the optical element is clearly reduced.

Therefore, an object of this invention is an optical element, in particular a lens, comprising an element body with an optically effective first region which has an optical axis, and a peripheral region extending in a circumferential direction of the element body and in which at least a first holding region is disposed. The first holding region has at least a first contact region which is designed to co-operate with a first holding device in order to hold the element body. The peripheral region forms the first contact region, in a manner limited in the circumferential direction of the element body, only in a first circumferential region limited in the circumferential direction. In addition or alternatively, the peripheral region forms the first contact region, in a manner limited in the direction of the optical axis, only at two contact surfaces of the element body spaced apart from one another in the direction of the optical axis, and which are respectively disposed in the region of a circumferential outer edge of the element body and from which at least one partially extends in the direction of the optical axis.

By limiting the first contact region in the circumferential direction, the first contact region does not have to be produced over the whole circumference of the element body. Corresponding processing of the element body in order to produce the first contact region must therefore for example not take place over its whole circumference. In this way, the cost of producing the first contact region is reduced considerably, if so required.

The same is achieved by limiting the first contact region in the direction of the optical axis and by limitation to two contact surfaces disposed in the region of a circumferential outer edge of the element body. The extension of at least one of the contact surfaces partially in the direction of the optical axis makes it possible here for the contact zone between the first holding device and the lens to be in the form of a self-adjusting clamp pairing with which a holding force predominantly in a radial direction is introduced into the lens. By means of the self-adjusting clamp pairing e.g. differences in level between the first holding devices are already equalised in the contact zone between the first holding device and the lens so that expensive mounting of the first holding devices becomes unnecessary. In this way, in other words, simple holding of the lens with as little stress as possible is made possible overall.

A further object of this invention is an optical arrangement with an optical element according to the invention and a first holding device which co-operates with a first holding region of the optical element.

A further object of this invention is a lens barrel, in particular a lens barrel for a microlithography device, with at least one optical module which comprises an optical arrangement according to the invention.

Finally, a further object of this invention is a microlithography device for transferring a pattern formed on a mask to a substrate with an optical projection system which comprises a lens barrel according to the invention.

Further preferred embodiments of the invention are given in the dependent claims and the following description of a preferred embodiment which makes reference to the attached drawings.

DETAILED DESCRIPTION OF THE INVENTION

In the following, with reference to FIGS. 1 to 3, a preferred embodiment of the optical arrangement 1 according to the invention with a preferred embodiment of the optical element 2 according to the invention is first of all described.

Figure 1:
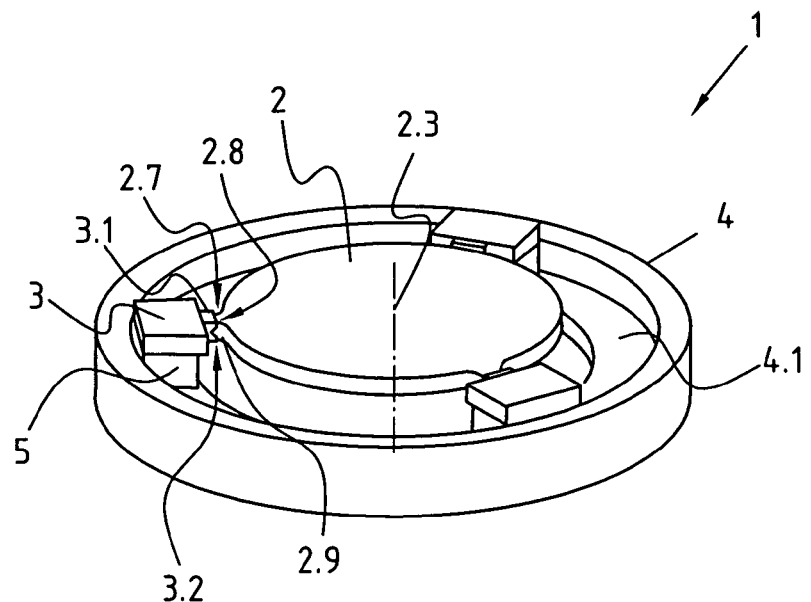
FIG. 1 is a schematic, perspective illustration of a preferred embodiment of the optical arrangement according to the invention with a preferred embodiment of the optical element according to the invention.

FIG. 1 shows here a schematic perspective illustration of the optical arrangement 1 with the optical element in the form of a lens 2. The lens 2 is supported by three first holding devices 3 evenly distributed around its circumference on a frame device in the form of a mounting 4.

The lens 2 has an element body in the form of a lens body 2.1. The lens body 2.1 comprises an optically effective first region 2.2 with an optical axis 2.3. This optically effective region 2.2 which is rotationally symmetric in relation to the optical axis 2.3 is defined on both sides of the lens 2 respectively by a corresponding optically effective surface 2.4 or 2.5 of the lens body 2.1.

The lens 2 has a peripheral region 2.6 adjoining the optically effective first region 2.2 radially outwards, and extending in the circumferential direction of the lens 2. This circumferential direction of the lens 2 lies in a plane orientated perpendicularly to the optical axis 2.3.

In the peripheral region 2.6, three identical first holding regions 2.7 are disposed, in a manner evenly distributed around the circumference of the lens body 2.1. Each holding region 2.7 has a first contact region 2.8 which co-operates with the corresponding first holding device 3 in order to hold the lens 2. The respective first contact region 2.8 is formed at a first projection 2.9 extending radially away from the optical axis. This first projection 2.9 extends in the circumferential direction of the lens 2 over a limited first circumferential region. This first circumferential region extends over an angular region of approximately 15°. The first circumferential region therefore only extends over approximately 4.2% of the circumference of the lens body 2.1.

The first projections 2.9 are produced in that material of the lens body lying between them in the circumferential direction is removed. This can be implemented, for example, by means of milling, grinding or other processing of the lens body 2.1 which removes material. Here, a method can advantageously be used which produces surfaces with lower surface quality than is necessary for the first contact region. The first projections, which could also be called holding noses, can therefore be produced comparatively quickly at low cost. The transition between the cylindrical peripheral region of the lens and the respective first projection is rounded in order to provide favourable stress distribution. However, it goes without saying that it can also be designed with sharp edges and/or with multiple steps if so required.

The contact region then to be formed on the respective first projection 2.9 requires higher surface quality. Due to the comparatively small surface of the lens body 2.1 to be processed for this on the respective projection 2.9, the cost for this is substantially reduced however.

A further advantage of this solution is the reduced mass of the lens 2 due to removal of the lens material. The lens material can therefore be removed up to close to the optically effective region 2.2, by means of which there is a substantial reduction in the mass of the lens 2. This mass reduction has a positive effect upon the dynamic behaviour of the optical arrangement 1 due to the associated increase in the resonant frequencies of the optical arrangement 1.

Figure 2:
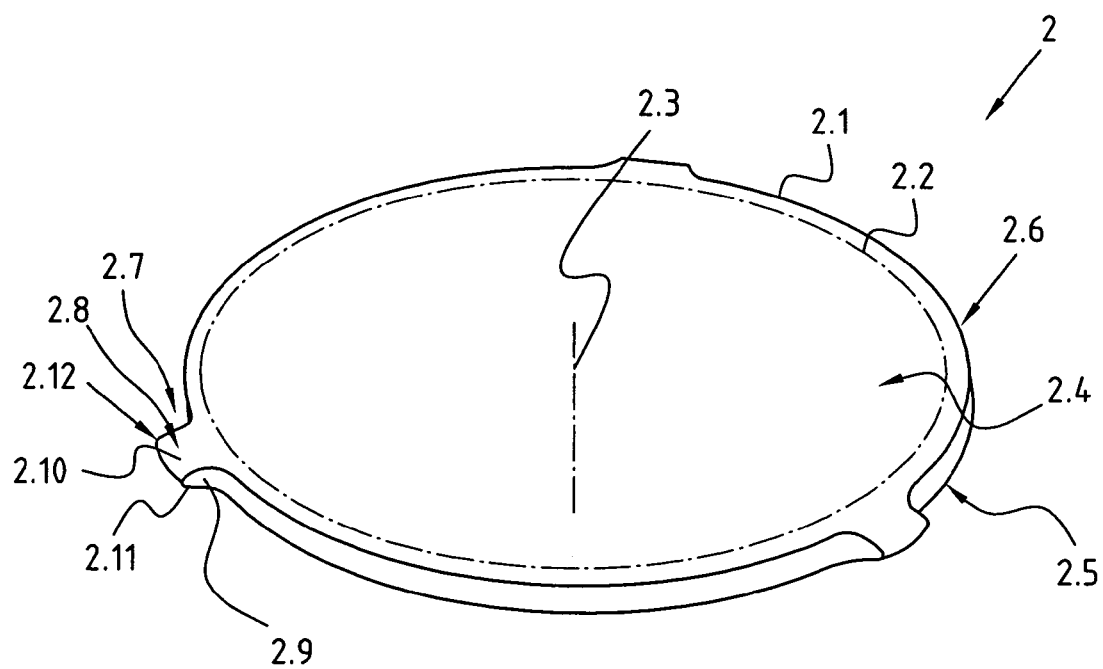
FIG. 2 is a schematic, perspective illustration of the optical element from FIG. 1.

As can be seen from FIG. 2, the first contact region 2.8 on the first projection 2.9 has a first contact surface 2.10 and a second contact surface 2.11. The first contact surface 2.10 continues the first optically effective surface 2.4 on the upper side of the lens 2, whereas the second contact surface 2.11 continues the second optically effective surface on the lower side of the lens 2. Because both the first optically effective surface 2.4 and the second optically effective surface 2.5 is curved twice, the first contact surface 2.10 and the second contact surface 2.11 is respectively curved twice. The first contact surface 2.10 and the second contact surface 2.11 are facing away from one another.

Figure 3:
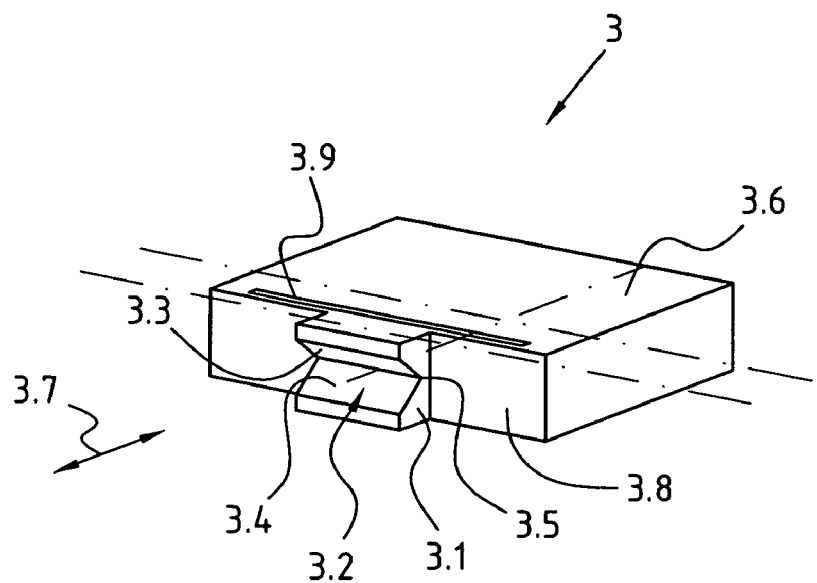
FIG. 3 is a schematic, perspective illustration of a first holding device from FIG. 1.

As can be seen in detail in FIG. 1, and in particular in FIG. 3, the first holding device 3 has a first holding element 3.1. The first holding element 3.1 has a second contact region 3.2 which co-operates with the first contact region 2.8 on the first projection 2.9 of the lens 2. The second contact region 3.2 is in the form of a symmetrical V-shaped groove with a planar third contact surface 3.3, a planar fourth contact surface 3.4 and a rounded groove base 3.5. The third contact surface 3.3 and the fourth contact surface 3.4 are facing towards one another. It goes without saying here that in other variations of the invention, the groove can also be asymmetrical in form in order to take into account the gravitational force.

The first holding element 3.1 is disposed resiliently on a first holding body 3.6. It may be resilient here in a direction 3.7 which extends at least approximately perpendicularly to the optical axis 2.3. The first holding element 3.1 is disposed substantially rigidly on the first holding element 3.6 in the direction of the optical axis 2.3. This is achieved by the central positioning of the first holding element 3.1 on a beam 3.8 clamped at both ends. This beam 3.8 is in turn formed by an elongated slot 3.9 extending, in the direction of the optical axis 2.3, through the first holding body 3.6.

The respective first holding element 3.1 lies with its respective second contact region 3.2 with a defined pre-stress in the direction of the optical axis 2.3 against the corresponding first contact region 2.8 of the lens 2. Due to the resilient design, this pre-stress remains substantially constant even with thermal expansion of the components during operation. In other words, by means of this design thermal deformation decoupling is achieved. A further advantage of this design is the equalisation of production tolerances which is achieved in this way.

The radius of the rounding in the base of the groove 3.5 of the holding element 3.1 is smaller than the radius on the outer end 2.12 of the first projection 2.9 on the transition between the first contact surface 2.10 and the second contact surface 2.11. The first contact surface 2.10 of the lens 2 is in contact with the third contact surface 3.3 of the first holding element 3.1. Due to the double curve of the first contact surface 2.10 and the planar form of the third contact surface 3.3, the result is a substantially point shaped contact location. The second contact surface 2.11 of the lens 2 is in contact with the fourth contact surface 3.4 of the first holding element 3.1. Here too, due to the double curve of the second contact surface 2.11 and the planar form of the fourth contact surface 3.4, the result is a substantially point shaped contact location. In the sense of this invention the term "substantially point shaped contact location" should be understood as meaning that with ideally rigid contact partners with an ideal geometry, point shaped contact would result. In fact, dependent upon the rigidity of the contact partners and their deviation from the ideal geometry, the result is of course a small point-like contact surface By means of this contact surface pairing with two substantially point shaped contact location per holding device, a self-adjusting clamp pairing is produced. In this way e.g. differences in level between the first holding devices 3 are already equalised in the contact zone between the first holding device 3 and the lens 2, without this leading to a substantial introduction of stress into the lens 2. In this way, an expensive mounting for the first holding devices 3 becomes unnecessary. The holding devices 3 hold the lens 2 here both by a positive and a frictional connection in the direction of their optical axis 2.1 and in the radial direction, and also by a frictional connection in the circumferential direction of the lens 2.

By means of the described design of the contact surfaces and the resilient mounting of the holding elements 3.1, a holding force predominantly orientated in the direction towards the optical axis 2.3 is produced which is introduced into the lens 2. The deformations of the lens are restricted here substantially to the respective projection 2.9 and therefore do not noticeably effect the optically effective region 2.2.

The holding bodies 3.6 are supported by support elements 5 on a circumferential annular flange 4.1 of the mounting 4. By means of these support elements 5, the relative position of the holding bodies 3.6 in relation to the flange 4 can be changed in the direction of the optical axis 2.3. In this way, the lens 2 can on the one hand be shifted in the direction of the optical axis 2.3. However, the optical axis 2.3 can also be tilted in relation to the plane of the annular flange 4.1.

It is particularly advantageous if the mounting 4 is made of a material which has at least approximately the same thermal expansion coefficient as the optical element. For example, the quartz/Invar pairing would be ideal. This means that there are no thermally caused expansion differences. The radial resilience of the holding devices then only serves to equalise the production tolerances. The level of force required in order to achieve the frictional connection can therefore be reduced within the mounting, and this has a positive effect upon the deformation of the optical element. The optical element is then held, largely in a positive connection, in all spatial directions.

In the simplest case, the respective support element 5 comprises one or more exchangeable spacing elements—so-called spacers—the thickness of which is chosen dependent upon the desired positioning of the lens 2. The respective support element 5 can also comprise any passive and/or active positioning devices. The passive positioning devices can be, for example, differential screws, etc. The active positioning devices can be, for example, piezo actuators, etc.

The connection between the holding body 3.6 and the support element 5 can be implemented in an arbitrary manner known per se, for example by means of a screw connection, an adhesive connection, a solder connection, a weld connection etc. The holding body 3.6 and the support element 5 can also be monolithic in form. The adjustment device can then be integrated, in a way known per se, into this type of monolithic structure with corresponding solid body joints.

Rotation of the lens 2 about its optical axis 2.3 is, on the one hand, to a certain degree made possible by corresponding rotation of the lens 2 in relation to the first holding devices 3. In order to guarantee a reliable contact here, the dimensions of the projections 2.9 in the circumferential direction of the lens 2 exceed the dimensions of the holding elements in this direction.

It goes without saying that this type of rotation of the lens 2 about its optical axis 2.3 is moreover also made possible by a corresponding rotation of the first holding devices 3 in relation to the flange 4 and, in addition or alternatively, also by a rotation of the flange 4. By means of the flange 4, if so required a translatory adjustment perpendicularly to the optical axis 2.3 is also possible, for example in order to centre the lens 2.

In this example, all of the first holding elements 3.1 are mounted resiliently. It goes without saying, however, that with other variations of this invention, not all of the holding elements need also be correspondingly resiliently mounted. In fact, it can suffice for a single holding element to be mounted resiliently in order to achieve the described effect.

Furthermore, in this example all of the first holding devices 3 are monolithic in form. It goes without saying, however, that with other variations of this invention provision can also be made such that the first holding devices are made up of several parts. In this way in particular, the material of the respective component can be chosen dependent upon its function. The holding element, for example, can therefore be made of a material with a high level of surface hardness in order to ensure long-term absorption of the high contact pressure. The beam which guarantees the resilience of the holding element can then be made of a material with correspondingly high elasticity, whereas the material of the holding body is designed for good coupling capability to the flange or to the support element. The individual components can be connected to one another here in a way known per se, for example by means of a screw connection, an adhesive connection, a solder connection, a weld connection etc.

Finally, it goes without saying that with other variations of this invention, if so required a different number of holding devices can also be provided. In particular, more than three holding devices can be provided.

Figure 4:
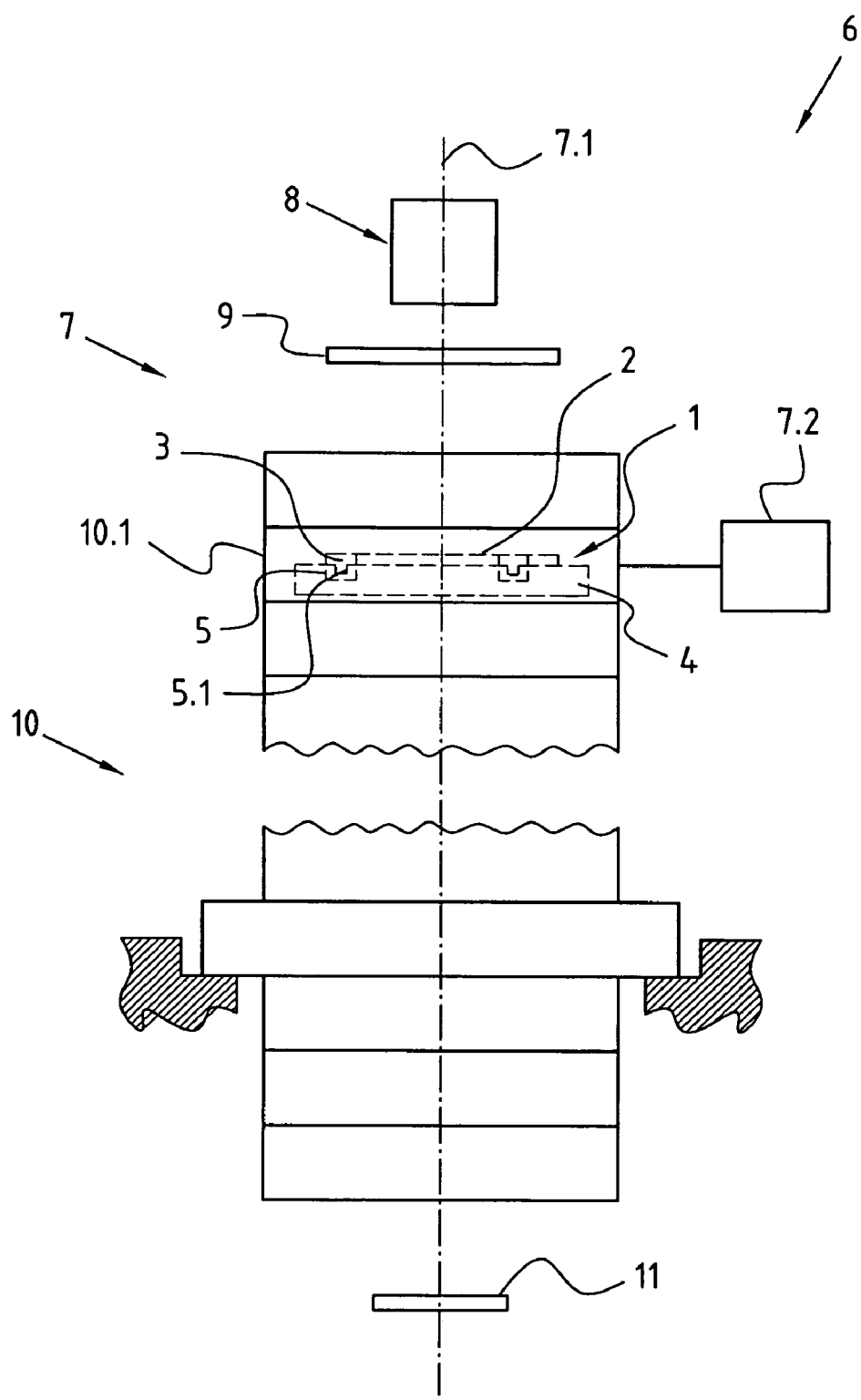
FIG. 4 is a schematic illustration of a preferred embodiment of the microlithography device according to the invention with a lens barrel according to the invention.

FIG. 4 is a schematic illustration of a preferred embodiment of the microlithography device 6 according to the invention. The microlithography device 6 comprises an optical projection system 7 with an illumination system 8, a mask 9 and a lens barrel 10. The illumination system 8 illuminates a mask 9. On the mask 9 there is a pattern which is projected by the lens barrel 10 onto a substrate 11, for example a wafer.

The lens barrel 10 comprises a series of optical modules with optical elements. The optical module 10.1 comprises the optical arrangement 1 from FIG. 1. The support elements 5 here comprise active positioning elements in the form of piezo actuators 5.1. By means of these piezo actuators 5.1, the lens 2, as already described, can be shifted in relation to the flange 4 in the direction of the optical axis 7.1 of the projection system 7 in order to change its distance from the optical elements of the adjacent optical modules. Likewise, the optical axis of the lens 2 can in this way also be tilted with respect to the optical axis 7.1. Both are controlled by a control device 7.2 connected to the piezo actuators 5.1, and serve in a known way to affect the imaging properties of the projection system 7.

Figure 5:
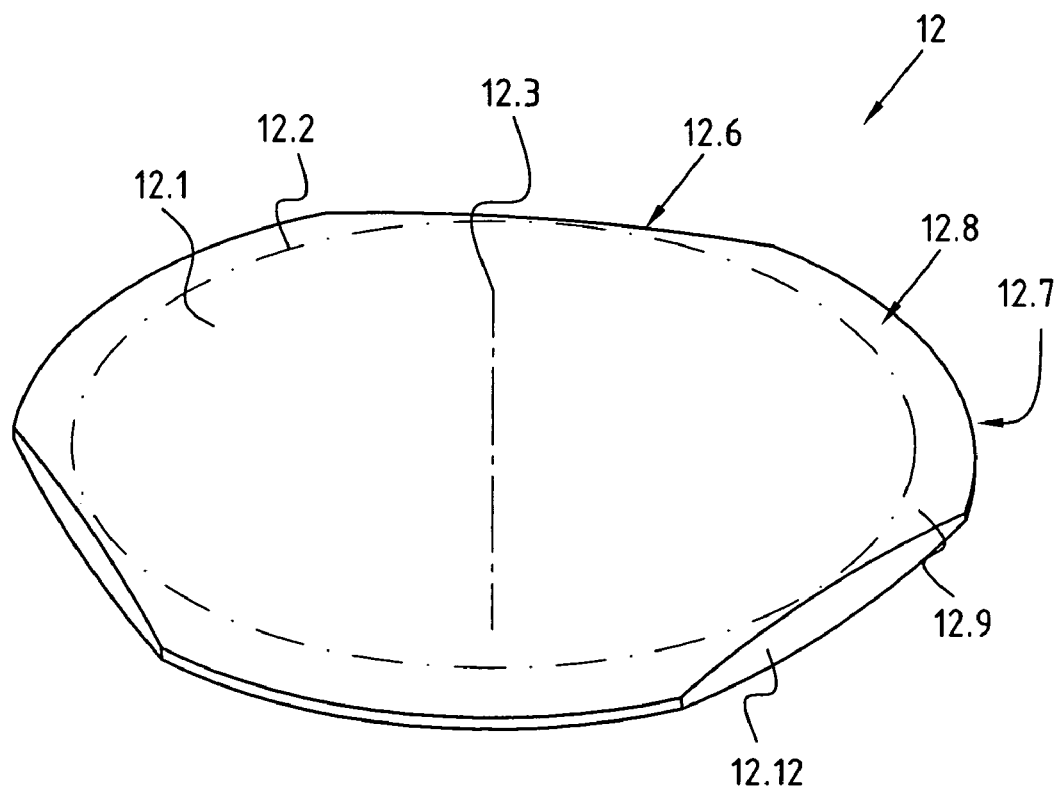
FIG. 5 is a schematic perspective illustration of a further preferred embodiment of the optical element according to the invention.

FIG. 5 is a schematic perspective illustration of a further preferred embodiment of the optical element according to the invention in the form of a lens 12. The lens 12 has an element body in the form of a lens body 12.1. The lens body 12.1 comprises an optically effective first region 12.2 with an optical axis 12.3.

The lens 12 has a peripheral region 12.6 adjoining the optically effective first region 12.2 radially outwards and extending in the circumferential direction of the lens 12. The circumferential direction of the lens 12 lies here in a plane orientated perpendicularly to the optical axis 12.3.

In the peripheral region 12.6, three identical first holding regions 12.7 are disposed, distributed evenly around the circumference of the lens body 12.1. Each holding region 12.7 has a first contact region 12.8 which co-operates with a corresponding first holding device in order to hold the lens 12. The respective first contact region 12.8 is formed on a first projection 12.9 extending radially away from the optical axis. This first projection 12.9 extends in the circumferential direction of the lens 12 over a limited first circumferential region. This first circumferential region extends over an angular region of approximately 72°. The first circumferential region therefore only extends over approximately 20% of the circumference of the lens body 12.1.

The first projections 12.9 are produced in that material lying between them in the circumferential direction has been removed. In so doing, in one, simple operation a planar peripheral surface 12.12 parallel to the optical axis 12.3 was produced respectively on the lens body 12.1.

As well as the particularly simple processing, there is also the advantage here that by removing the lens material, the mass of the lens 12 is reduced. The lens material can therefore be removed up to close to the optically effective region 12.2, which results in a considerable reduction in the mass of the lens 12. This mass reduction has a positive effect upon the dynamic behaviour of an optical arrangement with the lens 12 due to the associated increase in the resonant frequencies.

Figure 6:
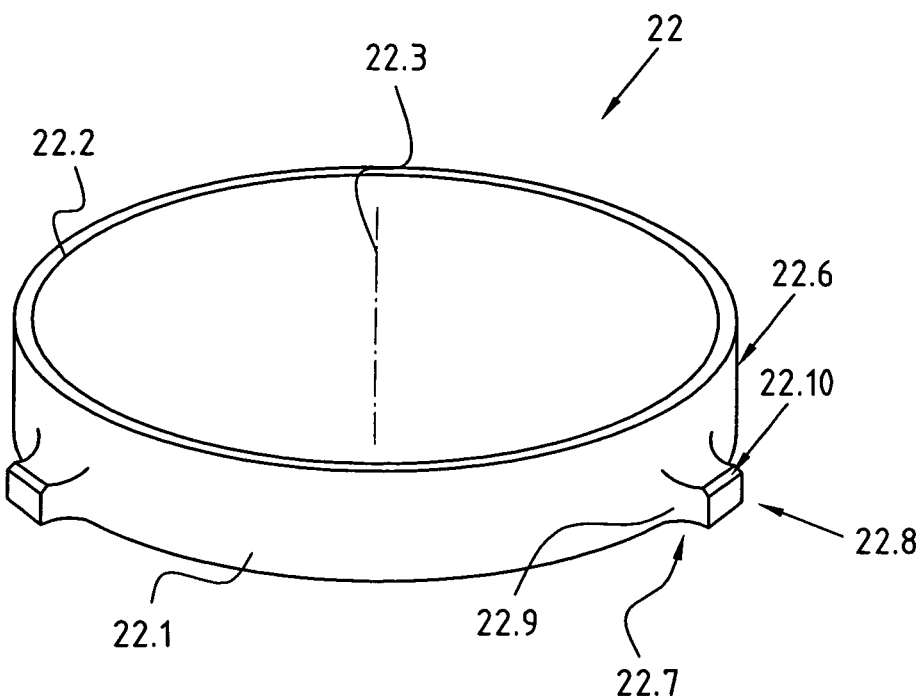
FIG. 6 is a schematic perspective illustration of a further preferred embodiment of the optical element according to the invention.

FIG. 6 is a schematic perspective illustration of a further preferred embodiment of the optical element according to the invention in the form of a lens 22 with a lens body 22.1. The lens body 22.1 comprises an optically effective first region 22.2 with an optical axis 22.3. The lens 22 has a peripheral region 22.6 adjoining the optically effective first region 22.2 radially outwards and extending in the circumferential direction of the lens 22.

In the peripheral region 22.6, three identical first holding regions 22.7 are disposed, evenly distributed around the circumference of the lens body 22.1. Each holding region 22.7 has a first contact region 22.8 which co-operates with the corresponding first holding device in order to hold the lens 22.

The respective first contact region 22.8 is formed on a first projection 22.9 extending radially away from the optical axis 22.3.

The first contact region 22.8 on the first projection 22.9 has a first contact surface 22.10 and a second contact surface 22.11. The first contact surface 22.10 is conical in form, whereas the second contact surface 22.1 lying on the lower side of the lens 22 and extending perpendicularly to the optical axis 22.3, is planar. The first contact surface 22.10 and the second contact surface 22.11 are facing away from one another.

The first projection 22.9 extends in the circumferential direction of the lens 2 over a limited first circumferential region. The latter extends over an angular region of approximately 15°. The first circumferential region therefore only extends over approximately 4.2% of the circumference of the lens body 22.1. The dimensions of the first projection 22.9 in the direction of the optical axis 22.3 are furthermore approximately a third of the dimensions of the element body 22.1 in the region adjacent to the first projection 22.9 in the direction of the optical axis. With these projections, which have approximately the same dimensions in the direction of the optical axis, it is possible to hold lenses with greatly differing dimensions with the same holding devices.

The first projections 22.9 are produced in that material of the lens body 22.1 lying between them in the circumferential direction and material lying above them in the direction of the optical axis 22.3 has been removed, as has already been described above. The transition between the cylindrical peripheral region of the lens and the respective first projection is rounded in order to achieve a favourable stress distribution.

Apart from the particularly simple processing, there is also the advantage here that by removing the lens material the mass of the lens 22 is reduced. The lens material can therefore be removed up to close to the optically effective region 22.2, by means of which there is a substantial reduction in the mass of the lens 22 even with this type of thick lens. The mass reduction has a positive effect upon the dynamic behaviour of an optical arrangement with the lens 22 due to the associated increase in the resonant frequencies.

Figure 7:
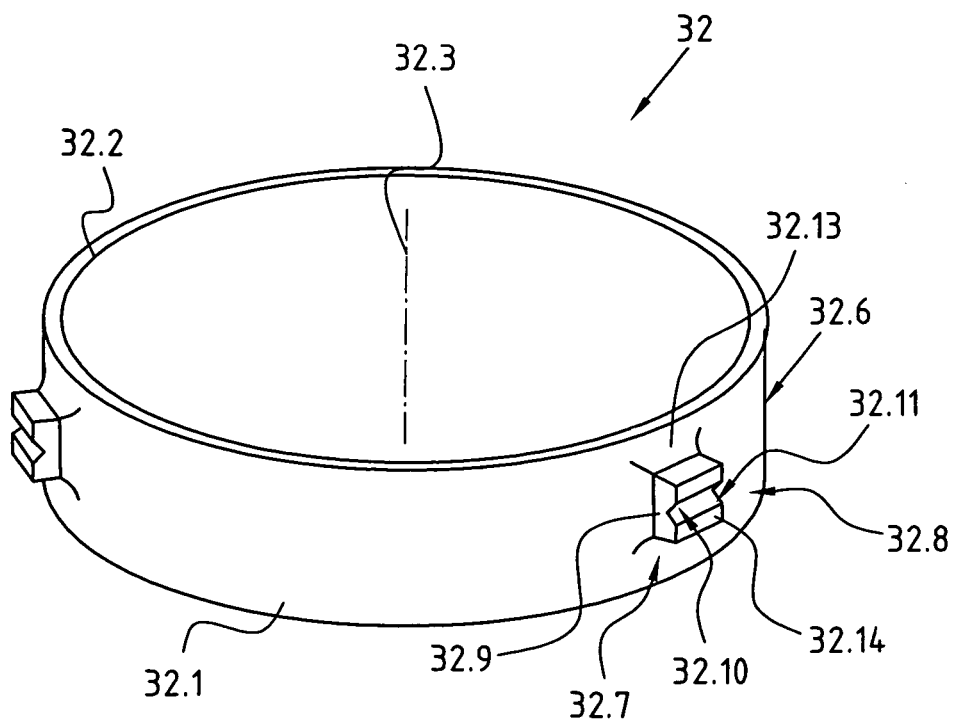
FIG. 7 is a schematic perspective illustration of a further preferred embodiment of the optical element according to the invention.

FIG. 7 is a schematic perspective illustration of a further preferred embodiment of the optical element according to the invention in the form of a lens 32 with a lens body 32.1. The lens body 32.1 comprises an optically effective first region 32.2 with an optical axis 32.3. The lens 32 has a peripheral region 32.6 adjoining the optically effective first region 32.2 radially outwards and extending in the circumferential direction of the lens 32.

In the peripheral region 32.6, three identical first holding regions 32.7 are disposed, distributed evenly around the circumference of the lens body 32.1. Each holding region 32.7 has a first contact region 32.8 which co-operates with the corresponding first holding device in order to hold the lens 32. The respective first contact region 32.8 is formed on a first projection 32.9 extending radially away from the optical axis 32.3.

The first contact region 32.8 on the first projection 32.9 has a V-shaped groove extending in a circumferential direction with a first contact surface 32.10 and a second contact surface 32.11. The first contact surface 32.10 and the second contact surface 32.11 are planar. The first contact surface 32.10 and the second contact surface 32.11 are facing towards one another.

The first projection 32.9 extends in the circumferential direction of the lens 2 over a limited first circumferential region. The latter extends over an angular region of approximately 15°. The first circumferential region therefore only extends over approximately 4.2% of the circumference of the lens body 2.1. The dimensions of the first projection 32.9 in the direction of the optical axis 32.3 are furthermore approximately 37% of the dimensions of the element body 32.1 in the region adjacent to the first projection 32.9 in the direction of the optical axis.

The first projections 32.9 are produced in that base elements 32.13 are first of all produced around the circumference of the lens body 22.1 by removing material of the lens body 22.1, as has already been described above. The transition between the cylindrical peripheral region of the lens and the respective first projection 32.9 is rounded in order to achieve favourable tension distribution. A contact block 32.14 is then placed on the respective base element 32.13, the former forming the first contact region 32.8.

The contact block 32.14 can be attached in any suitable way, for example by welding, soldering, adhesive bonding, fusion bonding etc. It can be made of the same material as the lens body 32.1. It is also possible to use a different material. Preferably, a material is used which has at least approximately the same thermal expansion coefficient as the material of the lens body 32.1. With a lens body made of quartz, for example, a material such as Invar or similar can be used for the contact block.

The advantage of this design is that the initial body of the lens 32 can have a relatively small diameter which exceeds, if only by a small amount, the diameter in the region of the base elements 32.13. In order to produce the holding regions, only few expensive lens material need then be removed, by means of which the production costs are reduced. The contact surfaces 32.10 and 32.11 can be produced simply on the contact block 32.14 in advance.

Apart from the particularly simple processing, it is also advantageous here that the mass of the lens 32 is reduced to a minimum. The lens material can therefore be removed up to close to the optically effective region 32.2 by means of which there is a substantial reduction in the mass of the lens 32, even with these thick lenses, and, thus, improvement in the dynamic behaviour of an optical arrangement with the lens 32.

Figure 8:
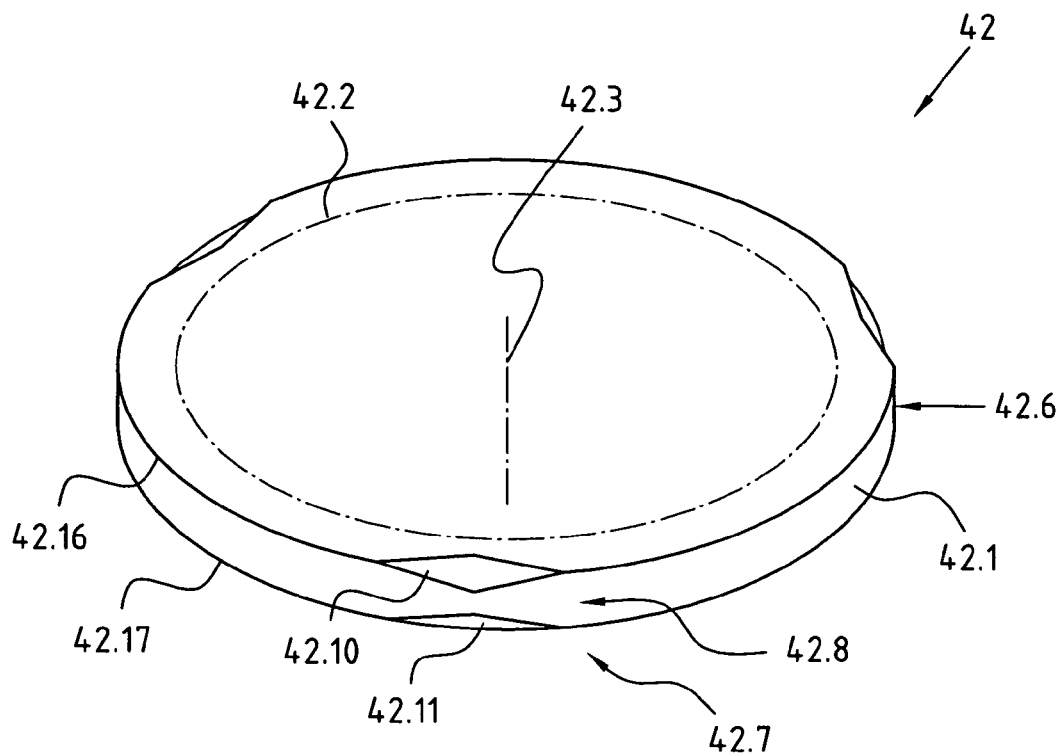
FIG. 8 is a schematic perspective illustration of a further preferred embodiment of the optical element according to the invention.

FIG. 8 is a schematic perspective illustration of a further preferred embodiment of the optical element according to the invention in the form of a lens 42 with a lens body 42.1. The lens body 42.1 comprises an optically effective first region 42.2 with an optical axis 42.3. The lens 42 has a peripheral region 42.6 adjoining the optically effective first region 42.2 radially outwards and extending in the circumferential direction of the lens 42.

In the peripheral region 42.6, three identical first holding regions 42.7 are disposed, evenly distributed around the circumference of the lens body 42.1. Every holding region 42.7 has a first contact region 42.8 which co-operates with a corresponding first holding device in order to hold the lens 42. The respective first contact region 42.8 extends in the circumferential direction of the lens 42 over a limited first circumferential region. This first circumferential region extends over an angular region of approximately 24°, and so only over approximately 6.7% of the circumference of the lens body 42.1.

The first contact region 42.8 has a first contact surface 42.10 and a second contact surface 42.11. The first contact surface 42.10 and the second contact surface 42.11 are planar form. They respectively extend, inclined with respect to the optical axis 42.3, so that they also extend in the direction of the optical axis 42.3. They are facing away from one another and are spaced apart from one another in the direction of the optical axis 42.3. The first contact surface 42.10 is disposed in the region of a first circumferential outer edge 42.16 of the lens body 42.1. The second contact surface 42.11 is disposed in the region of a second circumferential outer edge 42.17 of the lens body 42.1. The contact surfaces 42.10 and 42.11 are produced particularly easily in a single operation whereby material is removed from the lens body 42.1.

Figure 9:
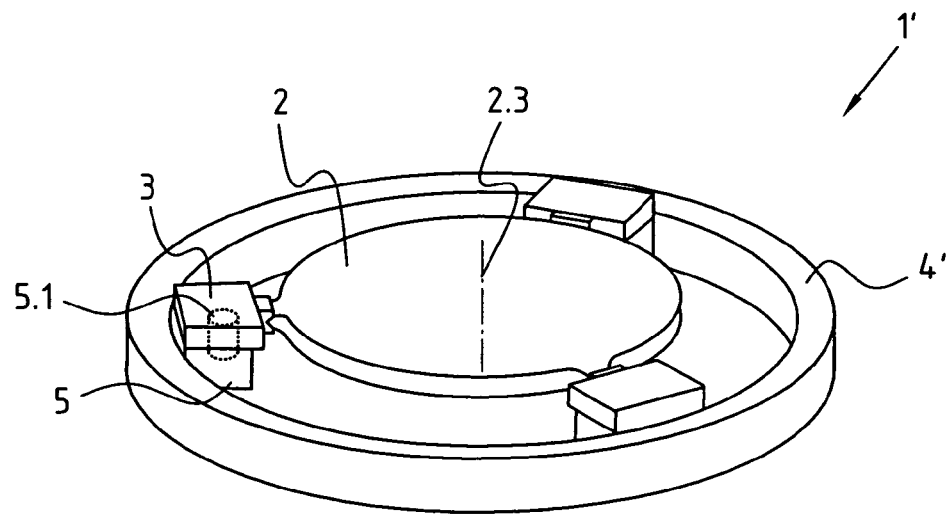
FIG. 9 is a schematic perspective illustration of a further preferred embodiment of the optical arrangement according to the invention with the optical element from FIG. 2.

FIG. 9 is a schematic perspective illustration of a further preferred embodiment of the optical arrangement 1' according to the invention with the lens 2 from FIG. 2. In its structure and function, the optical arrangement 1' in principle corresponds to the arrangement 1 of FIG. 1 such that only the differences are discussed here. The same components are provided here with the same reference numbers.

The difference is that the support elements 5 with the piezo actuators 5.1 which adjust the holding devices 3 in the direction of the optical axis 2.3 are not arranged and attached onto an annular flange of the mounting, but to the inner circumference of the annular mounting 4'.

In the following, with reference to FIGS. 10 to 12, a further preferred embodiment of the optical arrangement 1" according to the invention with a preferred embodiment of the optical element according to the invention in the form of a lens 52 is described. In its structure and function, the optical arrangement 1" in principle corresponds to the arrangement 1 of FIG. 1, such that mainly the differences will be discussed here.

The lens 52 has an element body in the form of a lens body 52.1. The lens body 52.1 comprises an optically effective first region 52.2 with an optical axis 52.3. This optically effective region 52.2, which is rotationally symmetrical in relation to the optical axis 52.3, is defined at both sides of the lens 52 respectively by a corresponding optically effective surface 52.4 or 52.5 of the lens body 52.1.

The lens 52 has a peripheral region 52.6, adjoining the optically effective first region 52.2 radially outwards and extending in the circumferential direction of the lens 52. The circumferential direction of the lens 52 lies here in a plane orientated perpendicularly to the optical axis 52.1.

Disposed in the peripheral region 52.6 is a first contact region 52.8 extending around the circumference of the lens body 52.1. It has two circumferential contact surfaces 52.10 and 52.11. The first contact region 52.8 co-operates with the three holding devices 13 and 14 which are distributed evenly around the circumference, in order to hold the lens 52.

Figure 11:
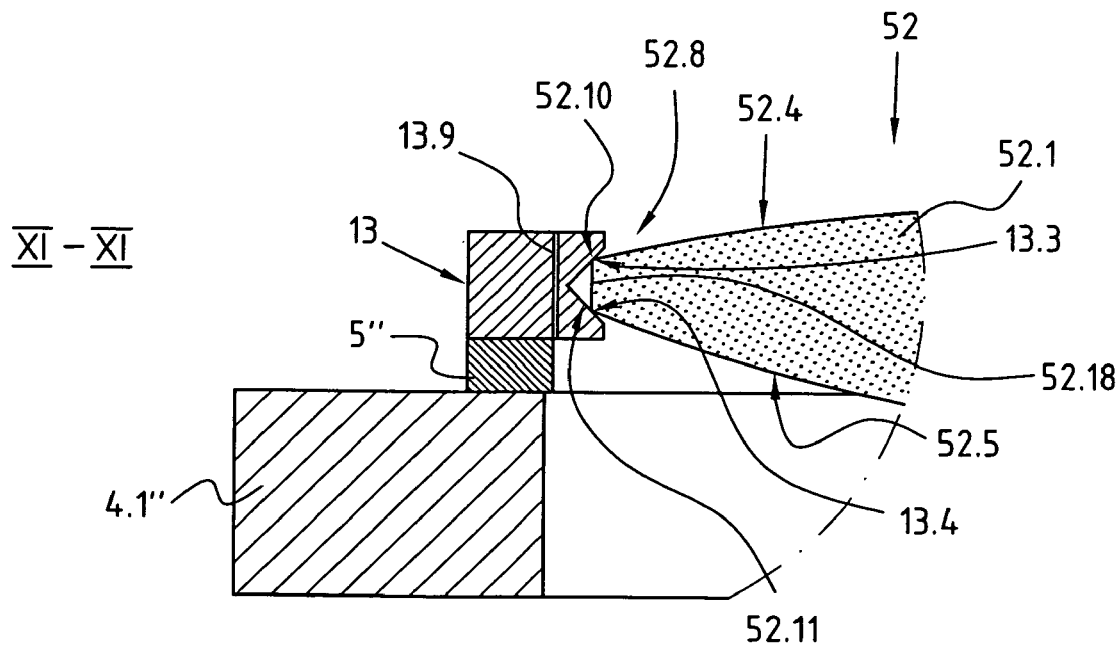
FIG. 11 is a schematic part-section through the optical arrangement from FIG. 10 along line XI-XI.

As can be seen in particular from FIG. 11, the first contact region 52.8 has a first contact surface 52.10 and a second contact surface 52.11 spaced apart therefrom in the direction of the optical axis. The first contact surface 52.10 is disposed in the region of a first circumferential outer edge 52.16 of the lens body 52.1. The second contact surface 52.11 is disposed in the region of a second circumferential outer edge 52.17 of the lens body 52.1. The first contact surface 52.10 continues the first optically effective surface 52.4 on the upper side of the lens 52, whereas the second contact surface 52.11 continues the second optically effective surface 52.5 on the lower side of the lens 52. The contact surfaces 52.10 and 52.11 are separated by a cylindrical peripheral section 52.18.

In the section illustrated in FIG. 11, the contact surfaces 52.10 and 52.11 show a rounding of the respective outer edge 52.16 and 52.17 which in the section shown in FIG. 11 extends over a rounding angle of less then 90°. They are produced particularly easily in a single operation in which material of the lens body 52.1 is removed. This can be implemented, for example, by milling, grinding, or other processing of the lens body 52.1 which removes material. Only the contact surfaces 52.10 and 52.11 need to have a corresponding surface quality here, whereas the cylindrical peripheral section 52.18 can be produced with a method which produces surfaces with a lower surface quality than is required for the first contact region 52.8. The contact surfaces 52.10 and 52.11 can be produced comparatively quickly, and at low cost, using conventional production equipment which can process a spatial angle of 90°.

Because both the first optically effective surface 52.4 and the second optically effective surface 52.5 are curved twice, the first contact surface 52.10 and the second contact surface 52.11 are also curved twice respectively. The first contact surface 52.10 and the second contact surface 52.11 are facing away from one another.

Figure 12:
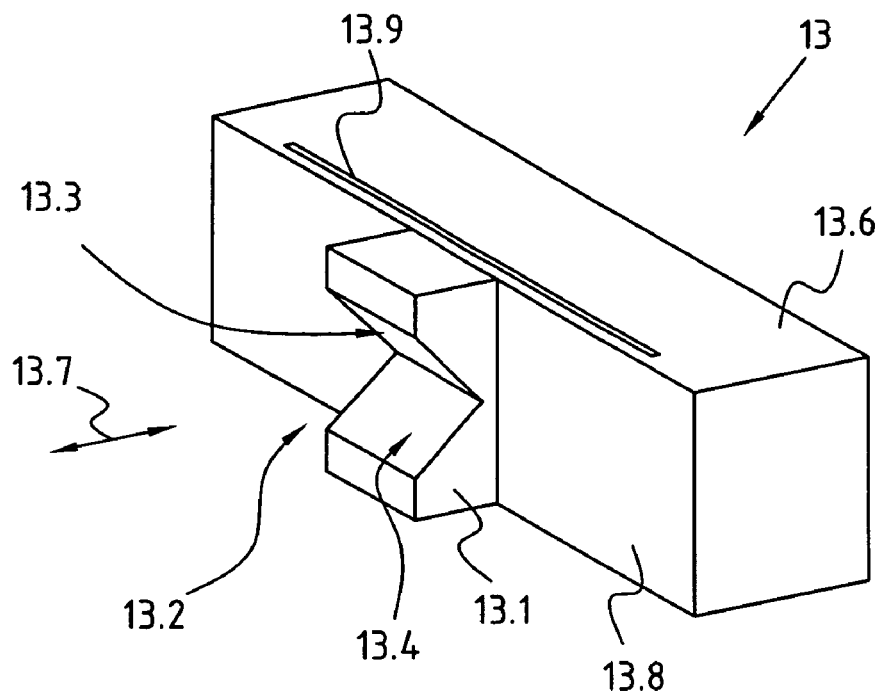
FIG. 12 is a schematic perspective illustration of a first holding device from FIG. 10.

As can be seen in detail in FIG. 11 and FIG. 12, the first holding device 13 has a first holding element 13.1. The first holding element 13.1 has a second contact region 13.2 which co-operates with the first contact region 52.8 of the lens 52. The second contact region 13.2 is in the form of a V-shaped groove with a planar third contact surface 13.3, and a planar fourth contact surface 13.4. The third contact surface 13.3 and the fourth contact surface 13.4 are facing towards one another.

The first holding element 13.1 is disposed resiliently on a first holding body 13.6. It is resilient in a direction 13.7 here which extends at least approximately perpendicularly to the optical axis 52.3. In the direction of the optical axis 52.3, the first holding element 13.1 is disposed substantially rigidly on the first holding body 13.6. This is achieved by the central positioning of the first holding element 13.1 on a beam 13.8 which is clamped at both ends. This beam 13.8 is formed in turn by an elongated slit 13.9 extending through the first holding body 13.6 in the direction of the optical axis 52.3

The second holding devices 14 only differ from the first holding device 14 in that their holding element extends over the whole width in the circumferential direction, and it is not mounted resiliently. In this way, the resonant frequency of the system is advantageously increased.

The first holding element 13.1 lies with its second contact region 13.2 with a defined pre-stress in the direction of the optical axis 52.3 against the corresponding first contact region 52.8 of the lens 52. Due to the resilient design, this pre-stress remains substantially constant, even when there is thermal expansion of the components during operation. In other words, by means of this design, thermal deformation decoupling is achieved. A further advantage of this design is the equalisation of production tolerances which is thus achieved.

The first contact surface 52.10 of the lens 52 is in contact with the third contact surface 13.3 of the first holding element 13.1. Due to the double curve of the first contact surface 52.10 and the planar form of the third contact surface 13.3, the result is a substantially point shaped contact location. The second contact surface 52.11 of the lens 52 is in contact with the fourth contact surface 13.4 of the first holding element 13.1 Here too, due to the double curve of the second contact surface 52.11 and the planar form of the fourth contact surface 13.4, the result is a substantially point shaped contact location.

By means of this contact surface pairing with two substantially point shaped contact locations per holding device a self-adjusting clamp pairing is produced. In this way e.g. differences in level between the first holding device 13 and the second holding devices 14 are already equalised in the respective contact zone between the holding device 13 or 14 and the lens 52 without this leading to substantial stresses being introduced into the lens 52.

Because of this, an expensive mounting for the holding devices 13 and 14 becomes unnecessary. The holding devices 13 and 14 hold the lens 52 here, both in a positive and a frictional connection in the direction of their optical axis 52.1 and in the radial direction, and in a frictional connection in the circumferential direction of the lens 52.

By means of the design of the contact surfaces and the resilient mounting of the holding element 13.1 as described, a holding force orientated in a predominantly radial direction results and is introduced into the lens 52.

The holding devices 13 and 14 are supported by support elements 5" on the mounting 4". By means of these support elements 5" the relative position of the holding bodies 13.6 in relation to the flange 4 in the direction of the optical axis 52.3 can be changed. In this way, the lens 52 can on the one hand be shifted in the direction of the optical axis 52.3. The optical axis 52.3 can however also be tilted in relation to the plane of the mounting 4".

In the simplest case, the respective support element 5" comprises one or more exchangeable spacing elements—so-called spacers—the thickness of which is chosen dependent upon the desired positioning of the lens 52. Likewise, the respective support element 5 can comprise any passive and/or active positioning devices. The passive positioning devices can for example be differential screws etc. The active positioning devices can be, for example, piezo actuators etc.

The connection between the holding devices 13 and 14 and the support element 5" can be implemented in any way known per se, for example by means of a screw connection, an adhesive connection, a solder connection, a weld connection etc. Likewise, the holding devices 13 and 14 and the support element 5" can be monolithic in form. The adjustment device can then be integrated in a way known per se into this type of monolithic structure with corresponding solid body joints.

A rotation of the lens 52 about its optical axis 52.3 is on the one hand made possible by a corresponding rotation of the lens 52 in relation to the holding devices 13 and 14. It goes without saying that this type of rotation of the lens 52 about its optical axis 52.3 is also made possible, moreover, by a corresponding rotation of the holding devices 13 and 14 in relation to the flange 4" and, in addition or alternatively, also by a rotation of the flange 4".

Furthermore, in this example all of the first holding devices 13 are monolithic in form. However, it goes without saying that with other variations of this invention provision can also be made to design the first holding devices with several parts, as has already been described above. Finally, it goes without saying that with other variations of this invention, a different number of holding devices can also be provided, if so required. In particular, more than three holding devices can be provided.

Figure 13:
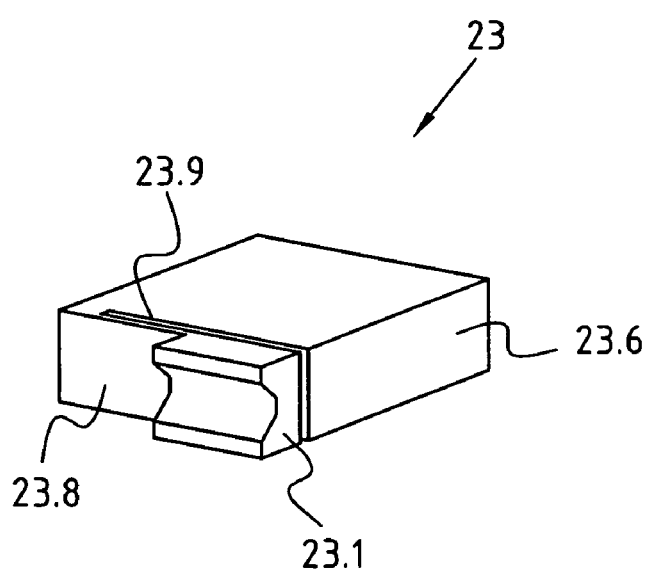
FIG. 13 is a schematic perspective illustration of a first holding device for a further preferred embodiment of the optical arrangement according to the invention.

FIG. 13 is a schematic perspective illustration of a first holding device 23 for a further preferred embodiment of the optical arrangement according to the invention. The first holding device 23 only differs from the first holding device 3 from FIG. 3 in that the first holding element 23.1 is disposed resiliently on the first holding body 23.6 by means of a beam 23.8 which is only clamped at one end. The beam 23.8 in turn is formed by an elongated slot 23.9 extending in the first holding body 23.6.

By means of schematic part-sections FIGS. 14 to 21 show different possibilities for the contact surface pairing between the optical element 62, 72, 82, 92, 102, 112, 122 and 132 and the respective first holding device 53, 33, 43, 23, 63, 73, 83 and 93.

Figure 14:
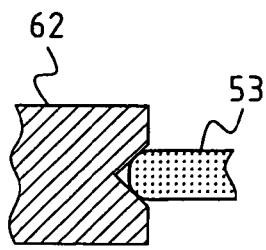
FIG. 14 is a schematic part-section through a further preferred embodiment of the optical arrangement according to the invention.
Figure 15:
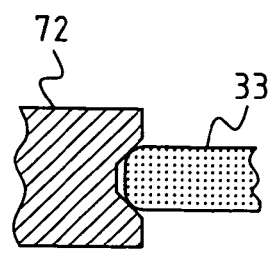
FIG. 15 is a schematic part-section through a further preferred embodiment of the optical arrangement according to the invention.

The contact surface pairings from FIGS. 14 and 15 resemble here the contact surface pairing as used with the lens 32 from FIG. 7. They are moreover also suitable with optical elements of corresponding thickness.

Figure 10:
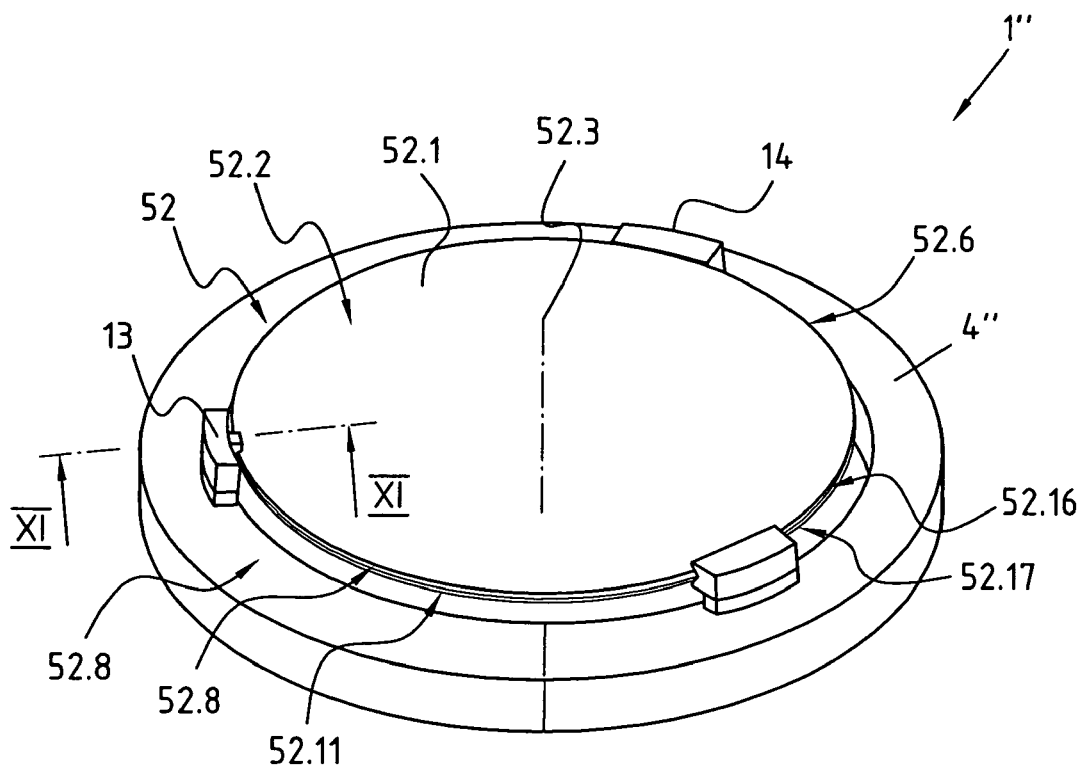
FIG. 10 is a schematic perspective illustration of a further preferred embodiment of the optical arrangement according to the invention with a preferred embodiment of the optical element according to the invention.
Figure 17:
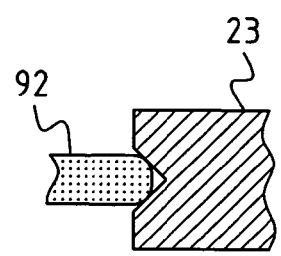
FIG. 17 is a schematic part-section through a further preferred embodiment of the optical arrangement according to the invention.
Figure 18:
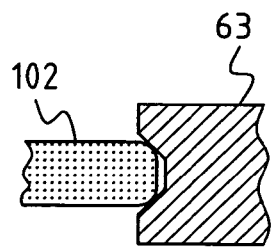
FIG. 18 is a schematic part-section through a further preferred embodiment of the optical arrangement according to the invention.
Figure 20:
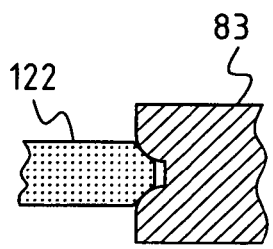
FIG. 20 is a schematic part-section through a further preferred embodiment of the optical arrangement according to the invention.

The contact surface pairings from FIGS. 17, 18 and 20 resemble, for a plane-parallel plate 92, 102 and 112, to the contact surface pairing, as can be used with the lens 52 from FIG. 10. Moreover, they are also particularly suitable for thin optical elements. It goes without saying here that in the sense of this invention, with such plane-parallel plates or similar, the optical axis of the optical element should correspond to the axis of symmetry of the optical element which stands perpendicularly on the plane in which the optical element generally extends.

Figure 16:
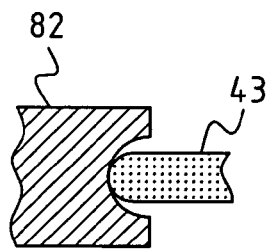
FIG. 16 is a schematic part-section through a further preferred embodiment of the optical arrangement according to the invention.
Figure 19:
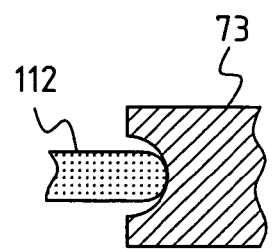
FIG. 19 is a schematic part-section through a further preferred embodiment of the optical arrangement according to the invention.
Figure 21:
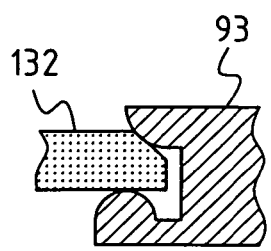
FIG. 21 is a schematic part-section through a further preferred embodiment of the optical arrangement according to the invention.

The contact surface pairing from FIG. 21 resembles the contact surface pairing as can be used with the lens 22 from FIG. 6. FIGS. 16 and 19 show special cases of contact surface pairing respectively with a single contact point.

In all cases it goes without saying that by corresponding adaptation of the respective curves of the contact surfaces, instead of a substantially point shaped contact location, a substantially linear shaped contact location can also be provided. Likewise, a contact location which is laminar at the outset can also be provided. The contact locations of different types can also be combined with one another here in any way within a contact surface pairing.

FIGS. 22 to 25 show different variations of the holding devices 103, 113, 123 and 24, as can be used, for example, for holding the lens 32 from FIG. 7.

Figure 22:
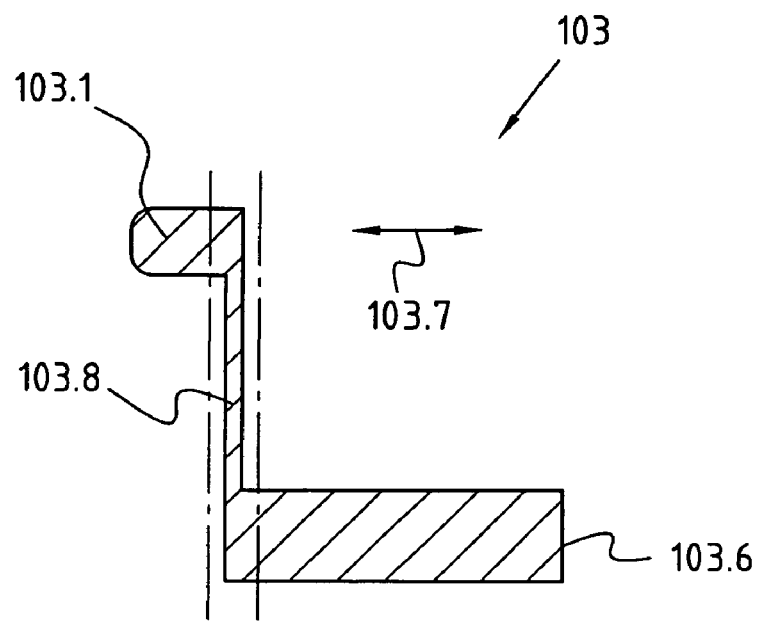
FIG. 22 is a schematic part-section through a first holding device for a further preferred embodiment of the optical arrangement according to the invention.

FIG. 22 is a schematic part-section through the first holding device 103 with which the first holding element 103.1 is disposed resiliently by means of a first beam 103.8, clamped at one end, in the direction 103.7, on the first holding body 103.6.

Figure 23:
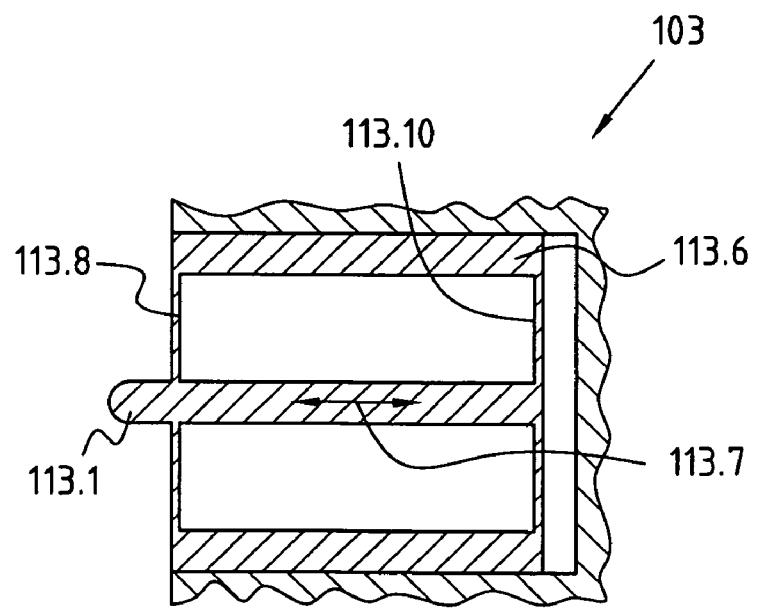
FIG. 23 is a schematic part-section through a first holding device for a further preferred embodiment of the optical arrangement according to the invention.

FIG. 23 is a schematic part-section through the first holding device 113 with which the first holding element 113.1 is disposed resiliently by means of two beams 113.8 and 113.10 clamped at both ends in the direction 113.7, on the two-part first holding body 113.6. The beams 113.8 and 113.10 form a parallelogram guide for the holding element 113.1

Figure 24:
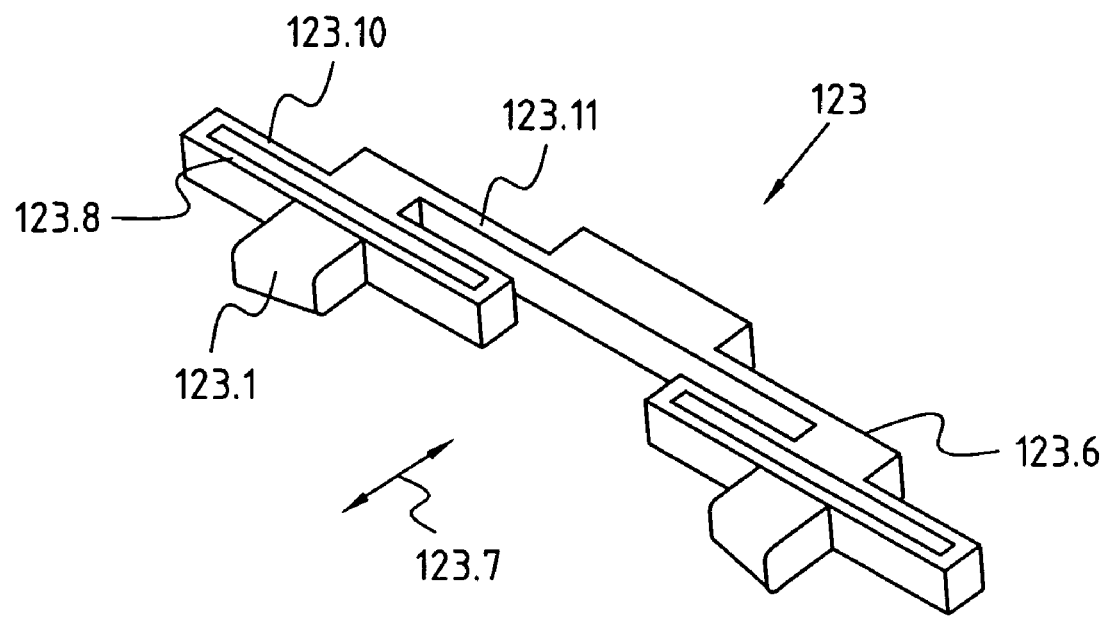
FIG. 24 is a schematic perspective illustration of a first holding device for a further preferred embodiment of the optical arrangement according to the invention.

FIG. 24 is a schematic perspective illustration of the first holding device 123 with which two first holding elements 123.1 are respectively connected by means of two parallel-disposed beams 113.8 and 113.10 connected to one another at both ends on a beam connected on one side to the first holding body 123.6. In this way, as well as resilient mounting in the direction 123.7, distribution of the contact loads over several contact locations is also achieved. This design is especially suitable for the holding of optical elements with which the first holding region extends over a corresponding length in the circumferential direction. In a particularly advantageous embodiment, the first holding device 123 is made of a material which has the same thermal expansion coefficient as the optical element. The advantage of this is that temperature differences do not result in any relative movement between the optical element and the holding device. No friction effects associated with stick-slip effects and hysteresis effects occur therefore. This solution is therefore exceptionally suitable for systems with which particularly stringent requirements are set for the positioning stability of the optical element.

Figure 25:
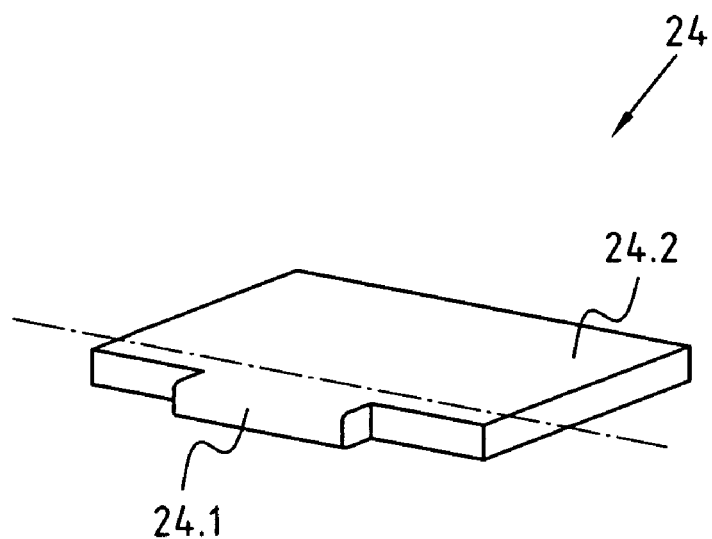
FIG. 25 is a schematic perspective illustration of a first holding device for a further preferred embodiment of the optical arrangement according to the invention.

Finally, FIG. 25 is a schematic perspective illustration of the second holding device 24 wherein the second holding element 24.1 is disposed rigidly on the second holding body 24.2. This second holding device 24 is suitable for holding the lens 32 from FIG. 7 with just one resilient first holding device, as was described in principle in connection with FIG. 10.

Figure 26:
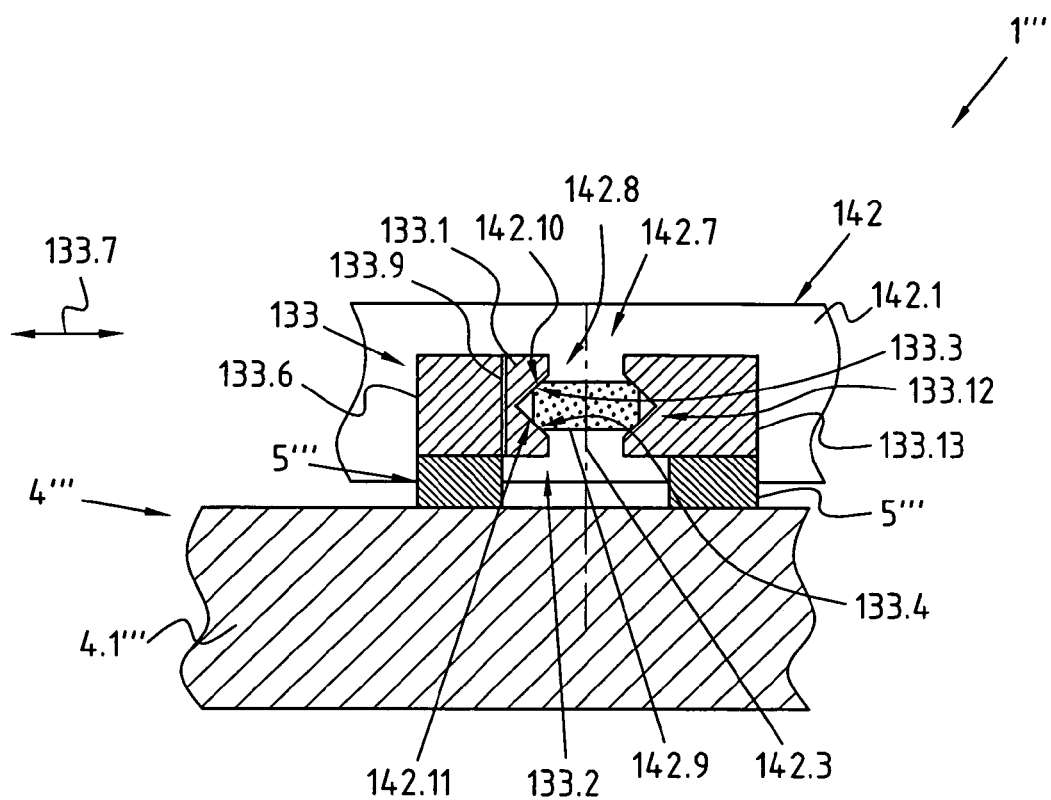
FIG. 26 is a schematic sectional illustration of a further preferred embodiment of the optical arrangement according to the invention with a preferred embodiment of the optical element according to the invention.

In the following, with reference to FIG. 26, a further preferred embodiment of the optical arrangement 1''' according to the invention with a preferred embodiment of the optical element according to the invention in the form of a lens 142 is described. FIG. 26 is a part-section, tangential to the circumferential direction of the lens 142, through the arrangement 1'''. In its structure and function, the optical arrangement 1''' resembles in principle to the arrangement 1 of FIG. 1 such that here it is generally the differences which are discussed.

The lens 142 has an element body in the form of a lens body 142.1. The lens body 142.1 comprises an optically effective first region with an optical axis 142.3. The optically effective region 142.2 which is rotationally symmetric in relation to the optical axis 142.3 is defined at both sides of the lens 142 respectively by a corresponding optically effective surface of the lens body 142.1.

The lens 142 has a peripheral region adjoining the optically effective first region radially outwards and extending in the circumferential direction of the lens 142. The circumferential direction of the lens 142 lies here on a plane orientated perpendicularly to the optical axis 142.3.

In the peripheral region, three identical first holding regions 142.7 are disposed, evenly distributed around the circumference of the lens body 142.1. Every holding region 142.7 has a first contact region 142.8 which co-operates with the corresponding first holding device 133 in order to hold the lens 142. The respective first contact region 142.8 is formed on a first projection 142.9 extending radially away from the optical axis 142.3. This first projection 142.9, which one could also call the holding nose, extends in the circumferential direction of the lens 142 over a limited first circumferential region. This first circumferential region extends over an angular region of approximately 15°. The first circumferential region therefore only extends over approximately 4.2% of the circumference of the lens body 142.1.

As can be seen in FIG. 26, the first contact region 142.8 has a first contact surface 142.10 and a second contact surface 142.11 on the first projection 142.9. The first contact surface 142.10 and the second contact surface 142.11 are respective envelope surfaces of a cylinder envelope segment, i.e. simply curved respectively. The envelope axis extends here respectively perpendicularly to the plane of the drawing which in turn is parallel to the optical axis 142.3. The first contact surface 142.10 and the second contact surface 142.11 are facing away from one another.

As can be seen from FIG. 26, the first holding device 133 has a first holding element 133.1. The first holding element 133.1 has a second contact region 133.2 which co-operates with the first contact region 142.8 on the first projection 142.9 of the lens 142. The second contact region 133.2 is in the form of a symmetrical V-shaped groove extending in a substantially radial direction with a planar third contact surface 133.3, a planar fourth contact surface 133.4 and a rounded groove base. The third contact surface 133.3 and the fourth contact surface 133.4 are facing towards one another. It goes without saying here that with other variations of the invention, the groove need not also be symmetrical in form due to consideration of the gravitational force.

The first holding element 133.1 is disposed resiliently on a first holding body 133.6. It be resilient here in a direction 133.7 which extends at least approximately in the circumferential direction of the lens 142. In the direction of the optical axis 142.3 the first holding element 133.1 is disposed substantially rigidly on the first holding body 133.6. This is achieved by the central positioning of the first holding element 133.1 on a beam clamped at both ends, as described above. This beam is once again formed by an elongated slot 133.9 extending through the first holding body 133.6 in the direction of the optical axis 142.3.

Furthermore, the first holding device 133 has a second holding element 133.12 which lies opposite the first holding element 133.1 in the circumferential direction of the lens 142 in relation to the first projection 142.9. The second holding element 133.12 is designed to be symmetrical to the first holding element 133.1 in relation to the first projection 142.9. It co-operates with contact surfaces on the projection 142.9 which, in relation to the first projection 142.9 are designed to be symmetrical to the first contact surface 142.10 or the second contact surface 142.11, respectively. Unlike the first holding element 133.1, the second holding element 133.2 is however disposed rigidly on a second holding body 133.13.

The respective first holding element 133.1 lies with its second contact region 133.2 respectively with a defined pre-stress in the circumferential direction of the lens 142 against the corresponding first contact region 142.8 of the lens 142. The pre-stress correspondingly also acts between the second holding element 133.12 and the projection 142.9. In this way, in other words the lens 142 is clamped in the circumferential direction.

Due to the resilient design of the connection of the first holding element 133.1 to the first holding body 133.6, this pre-stress remains substantially constant, even when there is thermal expansion of the components during operation. In other words, by means of this design, thermal deformation decoupling is achieved. A further advantage of this design is the equalisation of production tolerances which is thus achieved.

The contact surfaces between the first holding device 133 and the first projection 142.9 are formed such that four substantially point shaped contact locations are produced. It goes without saying, however, that they can also be of a form such that four substantially line shaped contact locations are produced.

By means of this contact surface pairing with two substantially point shaped contact locations per holding device, a self-adjusting clamp pairing is produced. In this way e.g. differences in level between the first holding devices 133 are already equalised in the contact zone between the first holding device 133 and the lens 142 without this resulting in a substantial introduction of stresses into the lens 142. Due to this, an expensive mounting for the first holding devices 133 becomes unnecessary. The holding devices 133 hold the lens 142 here both by a positive and a frictional connection in the direction of their optical axis 142.3 and in the circumferential direction, and also by a frictional connection in the radial direction of the lens 142.

By means of the described design of the contact surfaces and the resilient mounting of the holding elements 133.1 a holding force orientated predominantly in the circumferential direction of the lens 142 results which is introduced into the lens 142. The deformations of the lens are substantially limited here to the respective projection 142.9, and so do not noticeably effect the optically effective region.

The holding bodies 133.6 and 133.13 are respectively supported by support elements 5''' on a circumferential annular flange 4.1''' of the mounting 4'''. By means of these support elements 5''' the relative position of the holding bodies 133.6 and 133.13 can be changed in relation to the flange 4''' in the direction of the optical axis 142.3. In this way, the lens 142 can on the one hand be shifted in the direction of the optical axis 142.3. The optical axis 142.3 can also be tilted however in relation to the plane of the annular flange 4.1'''.

It is particularly advantageous if the mounting 4'' is made of a material which has at least approximately the same thermal expansion coefficient as the optical element. For example, the quartz/Invar pairing would be ideal. This means that there are no thermally caused expansion differences. The tangential spring effect of the holding devices then only serves to equalise the production tolerances. The level of force required to achieve the frictional connection within the mounting can therefore be reduced, and this has a positive effect upon deformation of the optical element. The optical element is then held, largely in a positive connection, in all of the spatial directions.

In the simplest case the respective support element 5''' comprises one or more exchangeable spacing elements—so-called spacers—the thickness of which is chosen dependent upon the desired positioning of the lens 142. Likewise, the respective support element 5''' can comprise any passive and/or active positioning devices. The passive positioning devices can be, for example, differential screws etc. The active positioning devices can be, for example, piezo actuators etc.

The connection between the holding body 133.6 and the support element 5''' can be implemented in any way known per se, for example by means of a screw connection, an adhesive connection, a solder connection, a weld connection etc. Likewise, the holding body 133.6 and the support element 5''' can be monolithic in form. The adjustment device can then be integrated in a way known per se into this type of monolithic structure with corresponding solid body joints.

It goes without saying that this type of rotation of the lens 2 about its optical axis 2.3 is made possible by a corresponding rotation of the first holding devices 133 in relation to the flange 4''' and, in addition or alternatively, also by a rotation of the flange 4'''. By means of the flange 4''', if appropriate, a translatory adjustment perpendicular to the optical axis 142.3 is also possible, for example in order to centre the lens 142.

Furthermore, in this example, all of the first holding devices 133 are monolithic in design. However, it goes without saying that with other variations of this invention, provision can also be made such that the first holding devices are designed with several parts. In this way in particular the material of the respective component can be chosen dependent upon its function. For example, the holding element can therefore be produced from a material with a high level of surface hardness in order to guarantee long-term absorption of the high contact pressure. The beam which guarantees the resilience of the holding element can then be made of a material with correspondingly high elasticity, whereas the material of the holding body is designed for good coupling capability to the flange and the support element. The individual components can be connected to one another here in a way known per se, for example by means of a screw connection, an adhesive connection, a solder connection, a weld connection, etc.

Finally, it goes without saying that with other variations of this invention, another number of holding devices can also be provided, if so required. In particular, more than three holding devices can be provided.

With regard to the design, in particular the geometry, of the contact surfaces between the first holding device 133 and the first projection 142.9 it goes without saying that any other contact geometries can also be chosen. In particular, all of the contact geometries disclosed in the above examples of embodiments, for example the contact geometries of FIGS. 14 to 21, can also be used.

All of the variations of this invention described above have, in addition to the advantages described above, the advantage that the respective optical element can be fitted and removed as often as one wishes. Furthermore, in the fitted state, thermal processing of the optical element can be undertaken because no materials need be used which would be effected by this.

It goes without saying that the dimensions of the grooves, bevels and radii of the preceding embodiments are, among other things, dependent upon the size of the optical element to be held, the mechanical loads that occur, and the installation position of the optical arrangement in a superordinate structure.

What is claimed is:

1. An optical element comprising an element body with an optically effective first region which has an optical axis and a peripheral region extending in a circumferential direction of the element body, in which at least a first holding region is disposed, the first holding region having at least a first contact region that co-operates with a first holding device in order to hold the element body, characterised in that the peripheral region forms the first contact region, in a manner limited in the direction of the optical axis, only at two contact surfaces of the element body spaced apart from one another in the direction of the optical axis, which are respectively disposed in the region of a circumferential outer edge of the element body and of which at least one extends partially in the direction of the optical axis and of which the other one extends at most partially in the direction of the optical axis.

2. The optical element according to claim 1, characterised in that the first contact region is configured such that the first holding device co-operating with it holds the element body in the direction of the optical axis by a positive connection, and in the circumferential direction by a frictional connection.

3. The optical element according to claim 1, characterised in that at least one of the contact surfaces is planar, at least in sections, and/or curved, at least in sections in a plane including the optical axis or in a plane extending tangentially to the circumferential direction.

4. The optical element according to claim 1, characterised in that the element body has a surface in the first contact region, on the first contact surfaces, which deviates from the surface of the adjacent regions in a direction selected from the group consisting of the circumferential direction and the direction of the optical axis.

5. The optical element according to claim 1, characterised in that several first holding regions are provided which are disposed distributed in the circumferential direction, on the element body.

6. The optical element according to claim 1, characterised in that the optically effective region is formed in the manner of a lens or a plane-parallel plate.

7. The optical element according to claim 1, characterised in that the peripheral region forms the first contact region, in a manner limited in the circumferential direction of the element body, only at a first circumferential region being limited in the circumferential direction.

8. The optical element according to claim 7, characterised in that the first circumferential region extends over less than 30%, preferably less than 15%, and even more preferably less than 5% of the circumference of the element body.

9. The optical element according to claim 7, characterised in that the first circumferential region limited in the circumferential direction and comprising the first contact region is formed by a first projection on the element body extending away from the optical axis.

10. The optical element according to claim 9, characterised in that the dimensions of the first projection in the direction of the optical axis are only a part of the dimensions of the element body in the region adjacent to the first projection in the direction of the optical axis.

11. The optical element according to claim 9, characterised in that the first projection is at least partially formed by removing material from the element body.

12. The optical element according to claim 9, characterised in that the first projection is at least partially formed by a first contact body attached to the element body.

13. The optical element according to claim 12, characterised in that the first contact body is made of a material which, with regard to the thermal expansion coefficient, is adapted to the material of the element body, the contact body being of the same material as the element body.

14. The optical element according to claim 9, characterised in that the first contact region comprises a groove being V-shaped, and extending in a direction selected from the group consisting of the circumferential direction and the radial direction.

15. An optical arrangement with an optical element comprising an element body with an optically effective first region which has an optical axis and a peripheral region extending in a circumferential direction of the element body, in which at least a first holding region is disposed, the first holding region having at least a first contact region that co-operates with a first holding device in order to hold the element body, characterised in that the peripheral region forms the first contact region, in a manner limited in the direction of the optical axis, only at two contact surfaces of the element body spaced apart from one another in the direction of the optical axis, which are respectively disposed in the region of a circumferential outer edge of the element body and of which at least one extends partially in the direction of the optical axis and with a first holding device which co-operates with a first holding region of the optical element, characterised in that the first holding device exerts a clamping force as a holding force at least generally orientated in a direction selected from the group consisting of the radial direction of the optical element the circumferential direction of the optical element.

16. The optical arrangement according to claim 15, characterised in that the first holding device has a first holding element with a second contact region that co-operates with the first contact region.

17. The optical arrangement according to claim 16, characterised in that the first contact region and the second contact region are configured such that at a contact location between the element body and the first holding element there is a substantially point shaped contact or a substantially line shaped contact between the element body and the first holding element.

18. The optical arrangement according to claim 16, characterised in that the first contact region and the second contact region are configured such that the first holding device holds the element body in the direction of the optical axis by a positive connection, and in the circumferential direction, by a frictional connection.

19. The optical arrangement according to claim 16, characterised in that the first contact region has a first contact surface and a second contact surface, and the second contact region has a third contact surface co-operating with the first contact surface and a fourth contact surface co-operating with the second contact surface, the first contact surface and the second contact surface facing towards one another and the third contact surface and the fourth contact surface facing away from one another or the first contact surface and the second contact surface facing away from one another, and the third contact surface and the fourth contact surface facing towards one another.

20. The optical arrangement according to claim 16, characterised in that the holding device comprises a first holding body on which the first holding element is disposed resiliently in a direction substantially perpendicular to the optical axis or resiliently in the circumferential direction.

21. The optical arrangement according to claim 15, characterised in that a frame device connected to the first holding device and a positioning device connected to the first holding device and the frame device is provided, the positioning device being configured to adjust the position of the first holding device in relation to the frame device in the direction of the optical axis.

22. The optical arrangement according to claim 15, characterised in that several first holding devices are provided which are disposed distributed in the circumferential direction of the optical element.

23. The optical arrangement according to claim 15, characterised in that the optical element has an element body with an optically effective first region which has an optical axis, and comprises a peripheral region extending in a circumferential direction of the element body in which at least a first holding region is disposed, wherein the first holding region has at least a first contact region that co-operates with a first holding device in order to hold the element body, the peripheral region forms the first contact region, in a manner limited in the direction of the optical axis, only at two contact surfaces of the element body spaced apart from one another in the direction of the optical axis which are respectively disposed in the region of a circumferential outer edge element body and of which at least one extends partially in the direction of the optical axis.

24. The optical arrangement according to claim 15, characterised in that at least one of the contact surfaces is planar, at least in sections, and/or curved, at least in sections, in a plane including the optical axis or in a plane extending tangentially to the circumferential direction.

25. The optical arrangement according to claim 15, characterised in that the element body in the first contact region, on the first contact surfaces, has a surface which deviates from the surface of the regions adjacent in the circumferential direction and/or in the direction of the optical axis.

26. The optical arrangement according to claim 15, characterised in that several first holding regions are provided which are disposed, distributed in the circumferential direction on the element body.

27. A first holding device for an optical arrangement according to claim 15.

28. The optical arrangement according to claim 15, characterised in that the peripheral region forms the first contact region, in a manner limited in the circumferential direction of the element body, only at a first circumferential region being limited in the circumferential direction.

29. The optical arrangement according to claim 28, characterised in that the first circumferential region limited in the circumferential direction and having the first contact region is formed by a first projection on the element body extending away from the optical axis.

30. The optical arrangement according to claim 29, characterised in that the dimensions of the first projection in the direction of the optical axis are only part of the dimensions of the element body in the region adjacent to the first projection in the direction of the optical axis.

31. The optical arrangement according to claim 29, characterised in that the first projection is formed at least partially by removing material from the element body.

32. The optical arrangement according to claim 29, characterised in that the first projection is formed at least partially by a first contact body attached to the element body.

33. The optical arrangement according to claim 32, characterised in that the first contact body is made of a material which, with regard to the thermal expansion coefficient, is adapted to the material of the element body, the contact body being of the same material as the element body.

34. The optical arrangement according to claim 29, characterised in that the first contact region comprises a groove being V-shaped and extending in a direction selected from the group consisting of the circumferential direction and the radial direction.

35. The optical arrangement according to claim 28, characterised in that the first circumferential region extends over less than 30%, preferably less than 15%, and even more preferably less than 5% of the circumference of the element body.

36. A lens barrel for a microlithography device, with at least one optical module which comprises an optical arrangement with an optical element comprising an element body with an optically effective first region which has an optical axis and a peripheral region extending in a circumferential direction of the element body, in which at least a first holding region is disposed, the first holding region having at least a first contact region that co-operates with a first holding device in order to hold the element body, characterised in that the peripheral region forms the first contact region, in a manner limited in the direction of the optical axis, only at two contact surfaces of the element body spaced apart from one another in the direction of the optical axis, which are respectively disposed in the region of a circumferential outer edge of the element body and of which at least one extends partially in the direction of the optical axis, and with a first holding device which co-operates with a first holding region of the optical element, characterised in that the first holding device exerts a clamping force as a holding force at least generally orientated in a direction selected from the group consisting of the radial direction of the optical element and the circumferential direction of the optical element.

37. A microlithography device for transferring a pattern formed on a mask onto a substrate with an optical projection system which comprises a lens barrel for a microlithography device, with at least one optical module which comprises an optical arrangement with an optical element comprising an element body with an optically effective first region which has an optical axis and a peripheral region extending in a circumferential direction of the element body, in which at least a first holding region is disposed, the first holding region having at least a first contact region that co-operates with a first holding device in order to hold the element body, characterised in that the peripheral region forms the first contact region, in a manner limited in the direction of the optical axis, only at two contact surfaces of the element body spaced apart from one another in the direction of the optical axis, which are respectively disposed in the region of a circumferential outer edge of the element body and of which at least one extends partially in the direction of the optical axis, and with a first holding device which co-operates with a first holding region of the optical element, characterised in that the first holding device exerts a clamping force as a holding force at least generally orientated in a direction selected from the group consisting of the radial direction of the optical element and the circumferential direction of the optical element.

38. An optical element comprising:
   an element body having:
      an optically effective region that has an optical axis and a peripheral region extending in a circumferential direction of the element body;
      a holding region disposed in said peripheral region; and
      a contact region in said holding region,
   wherein said holding region co-operates with a holding device to hold said element body, and
   wherein said contact region is configured with a first contact surface and a second contact surface that are:
      (a) spaced apart from one another in a direction of said optical axis;
      (b) both inclined with respect to said optical axis; and
      (c) not parallel to one another.

* * * * *